(12) United States Patent
Feng

(10) Patent No.: US 12,720,692 B2
(45) Date of Patent: Aug. 25, 2026

(54) FOLDABLE DISPLAY DEVICE HAVING AUXILIARY SUPPORTING LAYER

(71) Applicant: Wuhan China Star Optoelectronics Semiconductor Display Technology Co., Ltd., Wuhan (CN)

(72) Inventor: Zikang Feng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/430,064

(22) PCT Filed: Jun. 17, 2021

(86) PCT No.: PCT/CN2021/100679

§ 371 (c)(1),
(2) Date: Dec. 8, 2022

(87) PCT Pub. No.: WO2022/252295

PCT Pub. Date: Dec. 8, 2022

(65) Prior Publication Data

US 2024/0040723 A1 Feb. 1, 2024

(30) Foreign Application Priority Data

Jun. 2, 2021 (CN) ......................... 202110615593.2

(51) Int. Cl.
*H05K 5/02* (2006.01)
*F16C 11/04* (2006.01)
*E05D 7/00* (2006.01)

(52) U.S. Cl.
CPC ............ *H05K 5/0226* (2013.01); *F16C 11/04* (2013.01); *E05D 7/00* (2013.01); *E05Y 2999/00* (2024.05)

(58) Field of Classification Search
CPC .... G06F 1/1681; G06F 1/1652; H05K 5/0226
See application file for complete search history.

(56) References Cited

U.S. PATENT DOCUMENTS 9,348,450 B1 * 5/2016 Kim .................... H04M 1/0268
9,470,404 B2 * 10/2016 Lee ......................... G09F 9/301
(Continued)

FOREIGN PATENT DOCUMENTS

CN 105096756 A 11/2015
CN 105448194 A 3/2016
(Continued)

OTHER PUBLICATIONS

International Search Report in International application No. PCT/CN2021/100679,mailed on Feb. 25, 2022.
(Continued)

*Primary Examiner* — Rockshana D Chowdhury
*Assistant Examiner* — Douglas R Burtner
(74) *Attorney, Agent, or Firm* — Nathan & Associates Patent Agents Ltd.; Menachem Nathan

(57) ABSTRACT

The present application discloses a foldable display device. The foldable display device includes a case; a hinge structure, wherein the hinge structure is accommodated in the case, the hinge structure includes a fixing mechanism and a supporting mechanism, and the supporting mechanism includes a first supporting plate and a second supporting plate; a flexible display panel main body, wherein the flexible display panel main body is arranged in the case; and an auxiliary supporting layer arranged between the flexible display panel main body and the hinge structure.

19 Claims, 6 Drawing Sheets

(56) References Cited

U.S. PATENT DOCUMENTS

| | | | | |
|---|---|---|---|---|
| 9,535,452 | B2* | 1/2017 | Ahn | G06F 1/1615 |
| 10,120,421 | B1* | 11/2018 | Hong | G06F 1/1652 |
| 10,365,691 | B2* | 7/2019 | Bae | G06F 1/1652 |
| 10,845,850 | B1* | 11/2020 | Kang | H04M 1/0268 |
| 10,883,534 | B2* | 1/2021 | Bae | G06F 1/1652 |
| 11,609,606 | B2* | 3/2023 | Myeong | G06F 1/1681 |
| 11,726,530 | B2* | 8/2023 | Kang | G06F 1/1681 361/679.27 |
| 12,047,521 | B2* | 7/2024 | Liao | H04M 1/0216 |
| 12,500,969 | B2* | 12/2025 | Xu | H04M 1/022 |
| 2015/0330614 | A1* | 11/2015 | Lee | B65D 85/38 206/45.23 |
| 2016/0212890 | A1 | 7/2016 | Jeong et al. | |
| 2017/0115701 | A1* | 4/2017 | Bae | G06F 1/16 |
| 2019/0075688 | A1 | 3/2019 | Chen et al. | |
| 2020/0245481 | A1* | 7/2020 | Yoon | H05K 5/0226 |
| 2020/0245501 | A1* | 7/2020 | Wu | F28F 3/02 |
| 2020/0257335 | A1* | 8/2020 | Kim | G06F 1/1641 |
| 2020/0267856 | A1* | 8/2020 | Hsu | G06F 1/1652 |
| 2021/0108677 | A1* | 4/2021 | Bae | G06F 1/1656 |
| 2021/0109566 | A1* | 4/2021 | Myeong | G06F 1/1616 |
| 2021/0120688 | A1* | 4/2021 | Wang | G06F 1/1681 |
| 2021/0165466 | A1* | 6/2021 | Kang | G06F 1/1681 |
| 2021/0211530 | A1* | 7/2021 | Jung | G06F 1/1681 |
| 2021/0227709 | A1* | 7/2021 | Sim | G09F 9/301 |
| 2021/0240232 | A1* | 8/2021 | Cheng | H04M 1/022 |
| 2021/0247815 | A1* | 8/2021 | Shim | G06F 1/1681 |
| 2021/0397226 | A1* | 12/2021 | Siddiqui | G06F 1/1616 |
| 2022/0303371 | A1* | 9/2022 | Liao | H04M 1/0216 |
| 2023/0353665 | A1* | 11/2023 | Han | G06F 1/1681 |

FOREIGN PATENT DOCUMENTS

| | | | |
|---|---|---|---|
| CN | 107731100 | A | 2/2018 |
| CN | 108648624 | A | 10/2018 |
| CN | 108877529 | A | 11/2018 |
| CN | 109637377 | A | 4/2019 |
| CN | 208806015 | U | 4/2019 |
| CN | 110035140 | A | 7/2019 |
| CN | 110769109 | A | 2/2020 |
| CN | 111064833 | A | 4/2020 |
| CN | 111681548 | A | 9/2020 |
| CN | 111682000 | A | 9/2020 |
| CN | 211693207 | U | 10/2020 |
| CN | 112019664 | A | 12/2020 |
| CN | 112150921 | A | 12/2020 |
| JP | 2019120939 | A | 7/2019 |
| KR | 20150130652 | A | 11/2015 |
| KR | 20160083608 | A | 7/2016 |
| KR | 20180003684 | A | 1/2018 |
| KR | 20190065972 | A | 6/2019 |
| KR | 20200070336 | A | 6/2020 |
| KR | 20210011737 | A | 2/2021 |

OTHER PUBLICATIONS

Written Opinion of the International Search Authority in International application No. PCT/CN2021/100679,mailed on Feb. 25, 2022.

Chinese Office Action issued in corresponding Chinese Patent Application No. 202110615593.2 dated Dec. 15, 2021, pp. 1-9.

Chinese Office Action issued in corresponding Chinese Patent Application No. 202110615593.2 dated Mar. 30, 2022, pp. 1-10.

Chinese Office Action issued in corresponding Chinese Patent Application No. 202110615593.2 dated May 25, 2022, pp. 1-8.

Eurasian Office Action issued in corresponding Eurasian Patent Application No. 202290757 dated Sep. 22, 2023, pp. 1-2.

Korean Office Action issued in corresponding Korean Patent Application No. 10-2021-7025931 dated Sep. 28, 2022, pp. 1-9.

Japanese Office Action issued in corresponding Japanese Patent Application No. 2021-553358 dated Aug. 14, 2023, pp. 1-11.

Extended European search report issued in corresponding European Patent Application No. 21904623.2 dated Mar. 31, 2025. pp. 1-10.

* cited by examiner

FOLDABLE DISPLAY DEVICE HAVING AUXILIARY SUPPORTING LAYER

BACKGROUND OF INVENTION

Field of Invention

The present application relates to the field of display, and in particular to a foldable display device.

Description of Prior Art

With the development of flexible OLED display technology, foldable electronic devices have both portability of ordinary electronic devices and ultimate experience of large-screen display after unfolding. Therefore, the foldable electronic devices have gradually become an important trend in development of mobile terminals, and have become an important field of competition among major terminal manufacturers.

At present, in order to prevent damage to a main body of a flexible display screen, an inner foldable display mechanism usually needs to be designed to make a supporting plate dodge the main body, so that the main body of the flexible display screen forms a "drop shape" in a bending area. When the flexible display panel main body is in a bent state, three supporting plates and a middle frame are used to support the bending area of the flexible display panel main body. However, when the flexible display panel main body is in a flattened state, a user feels a step difference and gap between the supporting plates in the bending area due to processing errors of the three support plates and the middle frame or due to a gap between the plates when touching the screen, thereby making the user experience worse.

SUMMARY OF INVENTION

An embodiment of the present application provides a foldable display device to solve the deficiencies in the related technology.

In order to realize the above-mentioned functions, the technical solutions provided by the embodiments of the present application are as follows:

A foldable display device includes:

a case including a first case and a second case;

a hinge structure accommodated in the case and connected to the first case and the second case, wherein the hinge structure includes a fixing mechanism and a supporting mechanism, and the supporting mechanism includes a first supporting plate located on one side of the fixing mechanism and corresponding to the first case and a second supporting plate located on another side of the fixing mechanism and corresponding to the second case, wherein the first supporting plate is rotatably connected to the one side of the fixing mechanism, and the second supporting plate is rotatably connected to the another side of the fixing mechanism;

a flexible display panel main body arranged in the case and located on one side of the first case, the second case, and the hinge structure;

an auxiliary supporting layer arranged between the flexible display panel main body and the hinge structure, wherein the auxiliary supporting layer covers at least a connection position between the first supporting plate and the first case, a connection position between the first supporting plate and the fixing mechanism, and a connection position between the second supporting plate and the fixing mechanism, and a connection position between the second supporting plate and the second case.

In the foldable display device provided by an embodiment of the present application, the flexible display panel main body includes: a bending area corresponding to the hinge structure and a non-bending area located on opposite sides of the bending area; and wherein the auxiliary supporting layer includes a first auxiliary supporting section and a second auxiliary supporting section that are arranged at intervals, a first gap is defined between the first auxiliary supporting section and the second auxiliary supporting section, and the first gap is defined corresponding to the bending area.

In the foldable display device provided by an embodiment of the present application, the first gap is less than or equal to 14 mm.

In the foldable display device provided by an embodiment of the present application, the first supporting plate includes a first support and a second support, the second supporting plate includes a third support and a fourth support, the first support is connected to the first case, the second support is rotatably connected to the one side of the fixing mechanism and the first support respectively, the fourth support is connected to the second case, and the third support is rotatably connected to the another side of the fixing mechanism and the fourth support respectively; and wherein the first auxiliary supporting section covers at least a connection position between the first support and the first case, a connection position between the first support and the second support, and a connection position between the second support and the fixing mechanism; the second auxiliary supporting section covers at least a connection position between the third support and the fixing mechanism, a connection position between the third support and the fourth support, and a connection position between the fourth support and the second case.

In the foldable display device provided by an embodiment of the present application, the second support includes a plurality of second sub-supports, adjacent ones of the second sub-supports are rotatably connected to each other, and the first auxiliary supporting section covers each connection position between adjacent ones of the second sub-supports; and wherein the third support includes a plurality of third sub-supports, adjacent ones of the third sub-supports are rotatably connected to each other, and the second auxiliary supporting section covers each connection position between adjacent ones of third sub-supports.

In the foldable display device provided by an embodiment of the present application, the first auxiliary supporting section includes a first auxiliary supporting part and a second auxiliary supporting part which are connected to each other, and the second auxiliary supporting section includes a third auxiliary supporting part and a fourth auxiliary supporting part which are connected to each other;

wherein when the foldable display device is in a folded state, the first support and the fourth support are arranged opposite to each other, the second support and the third support are arranged opposite to each other, the first support and the fourth support are arranged opposite to each other, the first support and the fourth support have a first included angle, the second support and the third support have a second included angle, and the first included angle is different from the second included angle; and wherein the first auxiliary supporting part and the third auxiliary supporting part are arranged opposite to each other, the second auxiliary supporting part and the fourth auxiliary supporting part are arranged opposite to each other, the first auxiliary supporting part and the third auxiliary supporting part have a third included angle θ3, the second auxiliary supporting part and the third fourth auxiliary supporting part have a fourth included angle θ4, and the third included angle θ3 is different from the fourth included angle θ4.

In the foldable display device provided by an embodiment of the present application, the third included angle is same as the first included angle, and the fourth included angle is same as the second included angle.

In the foldable display device provided by an embodiment of the present application, when the foldable display device is in a folded state, along a direction from the flexible display panel main body to the fixing mechanism, a distance between the second support and the third support gradually increases, the first included angle is smaller than the second included angle, and a distance between the second auxiliary supporting part and the third auxiliary supporting part gradually increases, and the third included angle is smaller than the fourth included angle.

In the foldable display device provided by an embodiment of the present application, the foldable display device further includes a heat dissipation layer located between the auxiliary supporting layer and the hinge structure, and the heat dissipation layer includes a first heat dissipation layer and second heat dissipation layer arranged at intervals;

wherein a first adhesive layer is provided between the first heat dissipation layer and the first auxiliary supporting section, a second adhesive layer is provided between the first auxiliary supporting section and the flexible display panel main body, a third adhesive layer is provided between the second heat dissipation layer and the second auxiliary supporting section, and a fourth adhesive layer is provided between the second auxiliary supporting section and the flexible display panel main body, wherein the first adhesive layer and the second adhesive layer are arranged at intervals, and the third adhesive layer and the fourth adhesive layer are arranged at intervals; and wherein the second adhesive layer covers the connection position between the first support and the first case and the connection position between the first support and the second support, and the fourth adhesive layer covers the connection position between the third support and the fourth support and the connection position between the fourth support and the second case.

In the foldable display device provided by an embodiment of the present application, a second gap is defined between the first adhesive layer and the third adhesive layer, the second gap is larger than the first gap, and the second gap is defined corresponding to the bending area.

In the foldable display device provided by an embodiment of the present application, a modulus of the auxiliary supporting layer is 10 to 250 GPa, and a thickness of the auxiliary supporting layer is 0.01 to 0.2 mm.

In the foldable display device provided by an embodiment of the present application, the fixing mechanism includes an intermediate supporting plate and a fixing bracket;

wherein the intermediate supporting plate is movably connected to the fixing bracket, the first supporting plate is located on one side of the intermediate supporting plate, and the second supporting plate is located on another side of the intermediate supporting plate; and wherein when the foldable display device is in a flattened state, the first supporting plate, the intermediate supporting plate, the second supporting plate, and the intermediate supporting plate together form a flat surface, wherein the auxiliary supporting layer covers at least the connection position between the first supporting plate and the first case, a gap between the first supporting plate and the intermediate supporting plate, a gap between the intermediate supporting plate and the second supporting plate, and the connection position between the second supporting plate and the second case.

In the foldable display device provided by an embodiment of the present application, the supporting mechanism further includes a fifth support and a sixth support, both the fifth support and the sixth support are movably connected to the fixing bracket, and the auxiliary supporting layer covers the fifth support and the sixth support in an orthographic projection direction of the supporting mechanism; and wherein when the foldable display device is in the flattened state, the fifth support and the sixth support are configured to support the intermediate supporting plate, and the intermediate supporting plate is located away from the fixing bracket.

In the foldable display device provided by an embodiment of the present application, the fifth support includes a protrusion, and the sixth support includes a protrusion, and when the foldable display device is in the flattened state, the protrusions are configured to support the intermediate supporting plate, and when the foldable display device is in a folded state, there is a gap between each of the protrusions and the intermediate supporting plate.

In the foldable display device provided by an embodiment of the present application, the hinge structure further includes a rotating mechanism, and the rotating mechanism includes a first connecting member and a second connecting member; and wherein one end of the first connecting member is rotatably connected to the fixing bracket, another end of the first connecting member is slidably connected to the first support, one end of the second connecting member is rotatably connected to the fixing bracket, and another end of the second connecting member is slidably connected to the fourth support.

In the foldable display device provided by an embodiment of the present application, the rotating mechanism further includes a first rotating member, a second rotating member, a first mounting member, and a second mounting member; and wherein the first rotating member is rotatably connected to the fixing bracket, the first mounting member is fixedly connected to the first support, the one end of the first connecting member is fixedly connected to the first rotating member, and the another end of the first connecting member is slidably connected to the first mounting member; wherein the second rotating member is rotatably connected to the fixing bracket, the second mounting member is fixedly connected to the fourth support, the one end of the second connecting member is fixedly connected to the second rotating member, and the another end of the second connecting member is slidably connected to the second mounting member.

In the foldable display device provided by an embodiment of the present application, the first connecting member includes a first main body portion and a first extension portion extending from one end of the first main body portion, and the second connecting member includes a second main body portion and a second extension portion extending from one end of the second main body portion; wherein the first main body portion is slidably connected to the first mounting member, the first extension portion is provided with a first hole for the first rotating member to pass through, the second main body portion is slidably installed on the second mounting member, and the second extension portion is provided with a second hole for the first rotating member to pass through.

In the foldable display device provided by an embodiment of the present application, the first mounting member is provided with a first sliding groove, the second mounting member is provided with a second sliding groove, the first main body portion is slidably installed in the first sliding groove, and the second main body portion is slidably installed in the second sliding groove.

In the foldable display device provided by an embodiment of the present application, the hinge structure further includes a positioning mechanism, and the positioning mechanism includes a positioning member; wherein the positioning member is sleeved on the first rotating member and the second rotating member, the positioning member includes a first protrusion facing toward the first extension portion of the first connecting member and a second protrusion facing toward the second extension portion of the second connecting member, the first extension portion of the first connecting member is provided with a first groove, and the second extension portion of the second connecting member is provided with a second groove; and wherein when the supporting mechanism is in the flattened state or in the folded state, the first protrusion is accommodated in the first groove, and the second protrusion is accommodated in the second groove.

In the foldable display device provided by an embodiment of the present application, the hinge structure further includes a synchronization mechanism, the synchronization mechanism includes a first synchronization element, a second synchronization element, and a third synchronization element, the first synchronization element is connected to the first rotating member, the second synchronization element is connected to the second rotating member, and the first synchronization element is synchronously connected to the second synchronization element through the third synchronization element so that the first rotating member and the second rotating member rotate synchronously.

In an embodiment of the present application, by disposing an auxiliary supporting layer above a connection position between the first supporting plate and the first case, a connection position between the first supporting plate and the fixing mechanism, a connection position between the second supporting plate and the fixing mechanism, and a connection position between the second supporting plate and the second case, so as to cover step differences at the connection positions of the first case, the first supporting plate, the fixing mechanism, the second supporting plate, and the second case under the auxiliary supporting layer when the flexible display panel main body is in a flattened state, the user experience is enhanced.

BRIEF DESCRIPTION OF DRAWINGS

Technical solutions and beneficial effects of the present application will be made obvious by describing the specific implementation manners of the present application in detail below in connection position with the accompanying drawings.

DETAILED DESCRIPTION OF PREFERRED EMBODIMENTS

Figure 1:
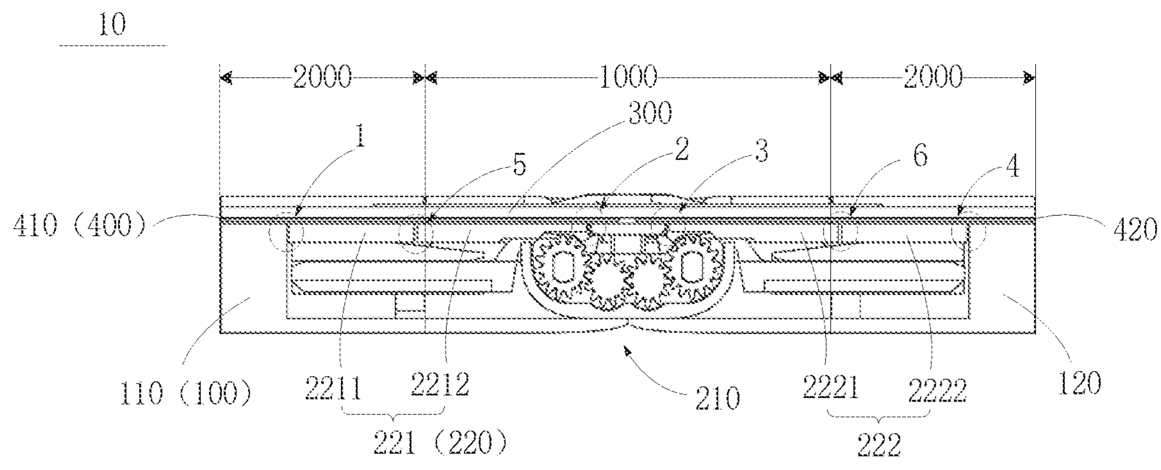
FIG. 1 is a schematic diagram of a foldable display device in an unfolded state provided by an embodiment of the present application.

This present application provides a foldable display device. In order to make the purpose, technical solution, and effect of the present application clearer and more definite, the present application is further described in detail below with reference to the accompanying drawings and examples. It should be understood that the specific embodiments described herein are only used to explain the present application, and are not used to limit the present application.

Referring to FIGS. 1-11, an embodiment of the present application provides a foldable display device 10, the foldable display device 10 includes a case 100, the case 100 includes a first case 110 and a second case 120; a hinge structure 200 accommodated in the case and connected to the first case 110 and the second case 120, wherein the hinge structure 200 includes a fixing mechanism 210 and a supporting mechanism 220, and the supporting mechanism 220 includes a first supporting plate 221 located on one side of the fixing mechanism 210 and corresponding to the first case 110 and a second supporting plate 222 located on another side of the fixing mechanism 210 and corresponding to the second case 120, wherein the first supporting plate 221 is rotatably connected to the one side of the fixing mechanism 210, and the second supporting plate 222 is rotatably connected to the another side of the fixing mechanism 210; a flexible display panel main body 300 arranged in the case 100 and located on one side of the first case 110, the second case 120, and the hinge structure 200; an auxiliary supporting layer 400 arranged between the flexible display panel main body 300 and the hinge structure 200.

The auxiliary supporting layer 400 covers at least a connection position between the first supporting plate 221 and the first case 110, a connection position between the first supporting plate 221 and the fixing mechanism 210, and a connection position between the second supporting plate 222 and the fixing mechanism 210, and a connection position between the second supporting plate 222 and the second case 120.

Figure 2:
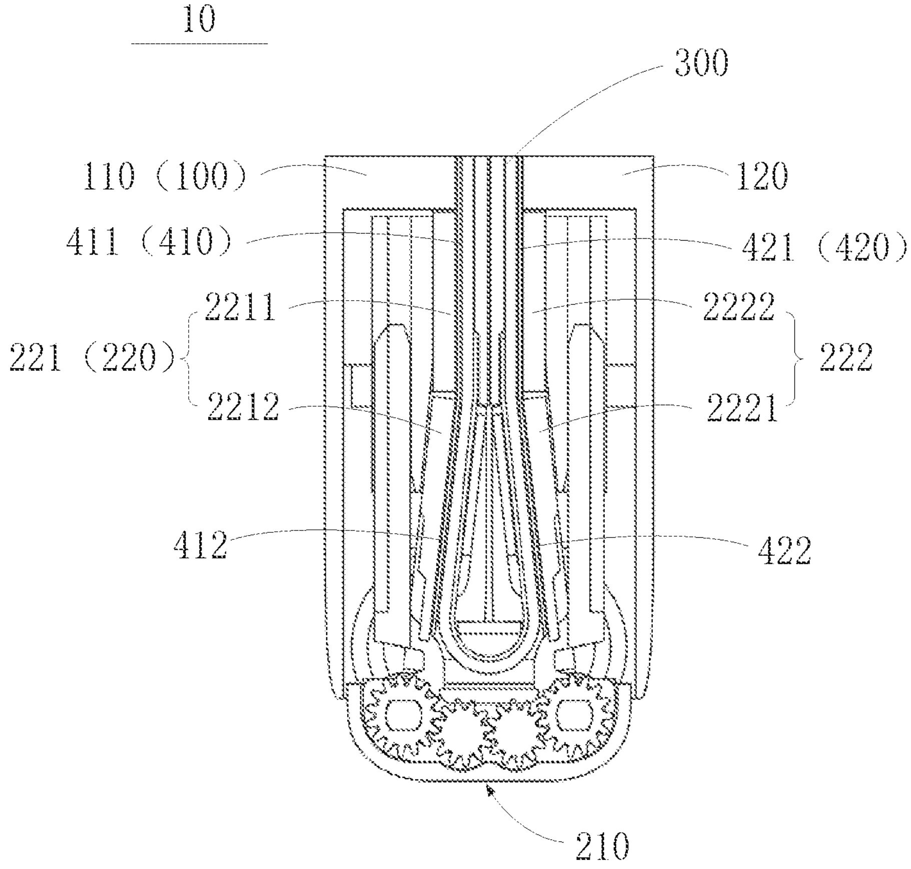
FIG. 2 is a schematic diagram of the foldable display device in a folded state provided by an embodiment of the present application.

In an embodiment of the present application, when the foldable display device 10 is switched from the state shown in FIG. 2 to the state shown in FIG. 1, that is, when the foldable display device 10 is in a flattened state, the auxiliary supporting layer 400 covers at least the connection position between the first supporting plate 221 and the first case 110, the connection position between the first supporting plate 221 and the fixing mechanism 210, the connection position between the second supporting plate 222 and the fixing mechanism 210, and the connection position between the second supporting plate 222 and the second case 120, so as to cover step differences at connection positions of the first case 110, the first supporting plate 221, the fixing mechanism 210, the second supporting plate 222, and the second case 120 under the flexible display panel main body 300 when the flexible display panel main body 300 is in the flattened state, thereby enhancing the user experience.

The technical solution of the present application will now be described in conjunction with specific embodiments.

FIG. 1 is a schematic diagram of a foldable display device in an unfolded state provided by an embodiment of the present application, and FIG. 2 is a schematic diagram of the foldable display device in a folded state provided by an embodiment of the present application.

Referring to FIG. 1 in connection with FIG. 2, this embodiment provides a foldable display device 10, the foldable display device 10 includes a case 100, the case 100 includes a first case 110 and a second case 120; a hinge structure 200 accommodated in the case and connected to the first case 110 and the second case 120, wherein the hinge structure 200 includes a fixing mechanism 210 and a supporting mechanism 220, and the supporting mechanism 220 includes a first supporting plate 221 located on one side of the fixing mechanism 210 and corresponding to the first case 110 and a second supporting plate 222 located on another side of the fixing mechanism 210 and corresponding to the second case 120, wherein the first supporting plate 221 is rotatably connected to the one side of the fixing mechanism 210, and the second supporting plate 222 is rotatably connected to the another side of the fixing mechanism 210; a flexible display panel main body 300 arranged in the case 100 and located on one side of the first case 110, the second case 120, and the hinge structure 200; an auxiliary supporting layer 400 arranged between the flexible display panel main body 300 and the hinge structure 200.

In this embodiment, a modulus of the auxiliary supporting layer 400 ranges from 10 GPa to 250 GPa, and a thickness of the auxiliary supporting layer 400 ranges from 0.01 mm to 0.2 mm A material of the supporting layer 400 includes, but is not limited to, metal stainless steel, spring steel sheet, and titanium alloy, and may be a whole piece of metal plate, or may also be a metal mesh structure. It is appreciated that there are no specific restrictions on the ranges of the modulus and the thickness and the types of the material in this embodiment.

Specifically, in this embodiment, a first gap 1 is defined at the connection position between the first supporting plate 221 and the first case 110, a second gap 2 is defined at the connection position between the first supporting plate 221 and the fixing mechanism, a third gap 3 is defined at the connection position between the second supporting plate 222 and the fixing mechanism 210, and a fourth gap 4 is defined at the connection position between the second supporting plate 222 and the second case 120.

In this embodiment, the auxiliary supporting layer 400 is configured to cover at least the connection position between the first supporting plate 221 and the first case 110, the connection position between the first supporting plate 221 and the fixing mechanism 210, the connection position between the second supporting plate 222, the connection position between the fixing mechanism 210 and the second supporting plate 222, and the connection position between the second supporting plate 222 and the second case 120, that is, the auxiliary supporting layer 400 covers the first gap 1, the second gap 2, the third gap 3, and the fourth gap 4, so as to cover step differences at connection positions of the first case 110, the first supporting plate 221, the fixing mechanism 210, the second supporting plate 222, and the second case 120 under the flexible display panel main body 300 when the flexible display panel main body 300 is in the flattened state, thereby enhancing the user experience.

In this embodiment, the flexible display panel main body 300 includes a bending area 1000 corresponding to the hinge structure 200 and non-bending areas 2000 located on opposite sides of the bending area 1000; and the auxiliary supporting layer 400 includes a first auxiliary supporting section 410 and a second auxiliary supporting section 420 arranged at intervals. A first gap (not shown) is defined between the first auxiliary supporting section 410 and the second auxiliary supporting section 420. The first gap is defined corresponding to the bending area 1000.

Specifically, an orthographic projection of an inner wall of the first gap on the fixing mechanism 210 is located within a boundary range of the fixing mechanism 210; and a distance between the first auxiliary supporting section 410 and the second auxiliary supporting section 420 is less than or equal to 14 mm.

Figure 3:
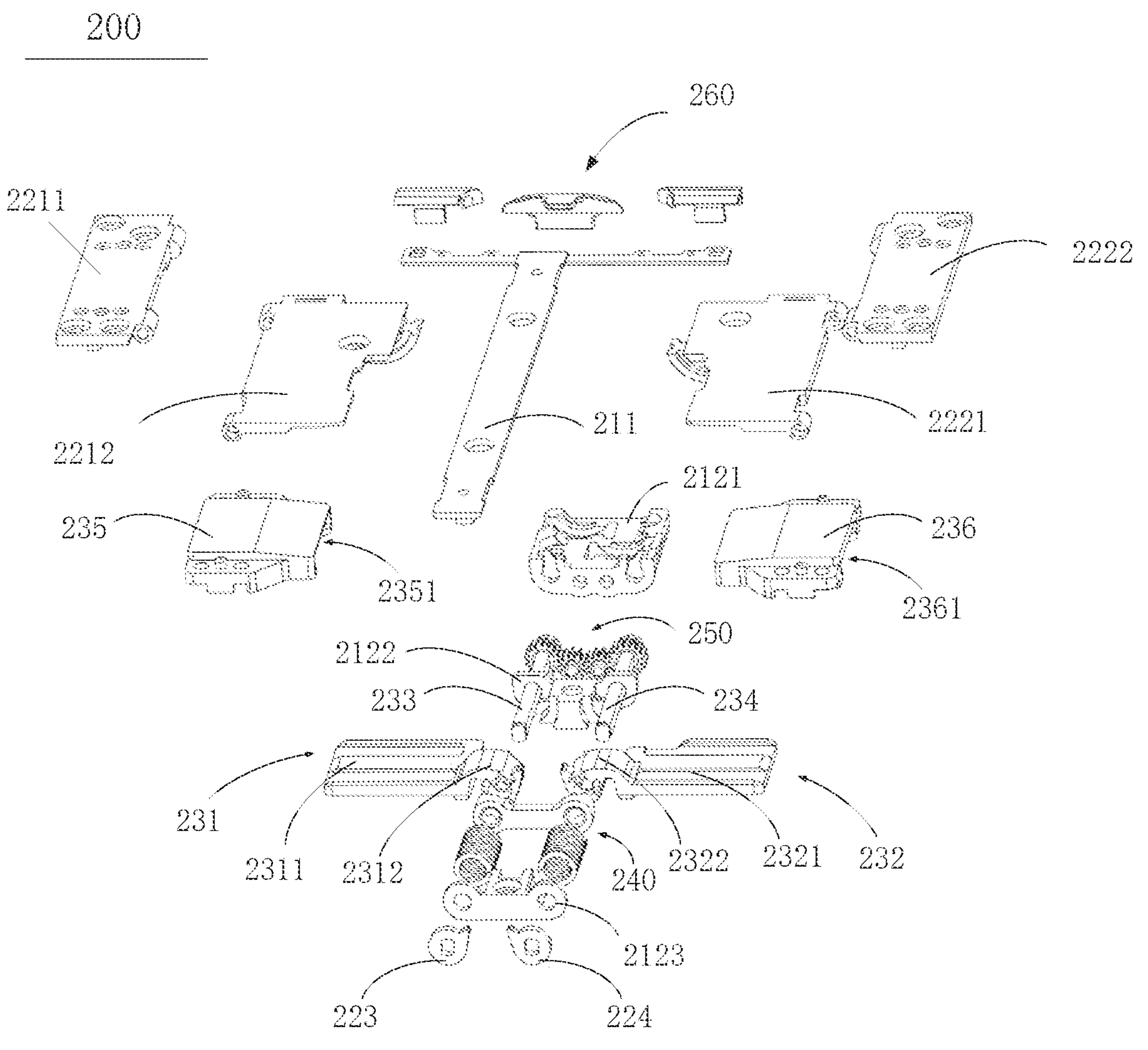
FIG. 3 is an exploded schematic diagram of a hinge structure of the foldable display device provided by an embodiment of the present application.
Figure 4:
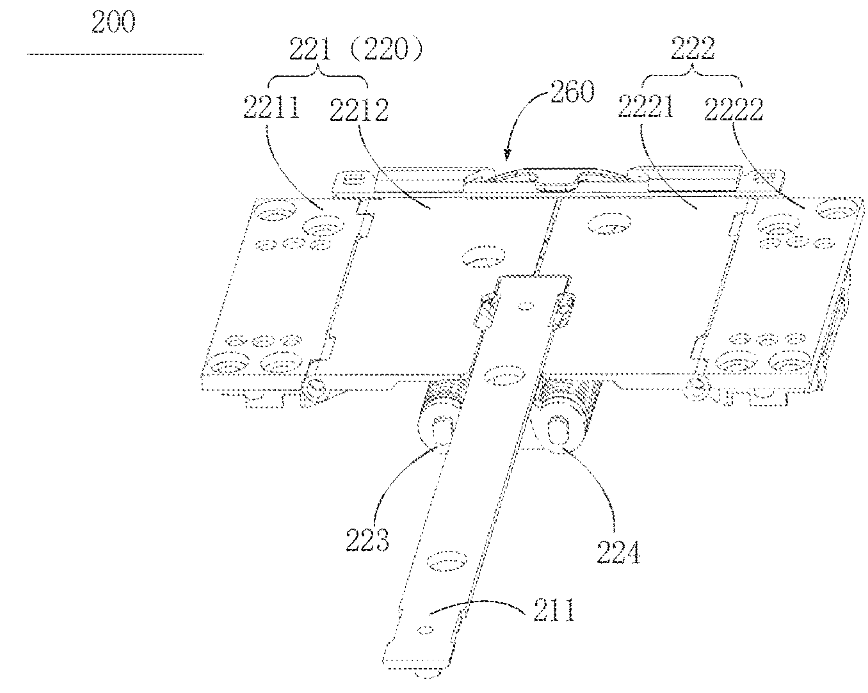
FIG. 4 is a schematic diagram of the hinge structure of the foldable display device in the unfolded state provided by an embodiment of the present application.
Figure 5:
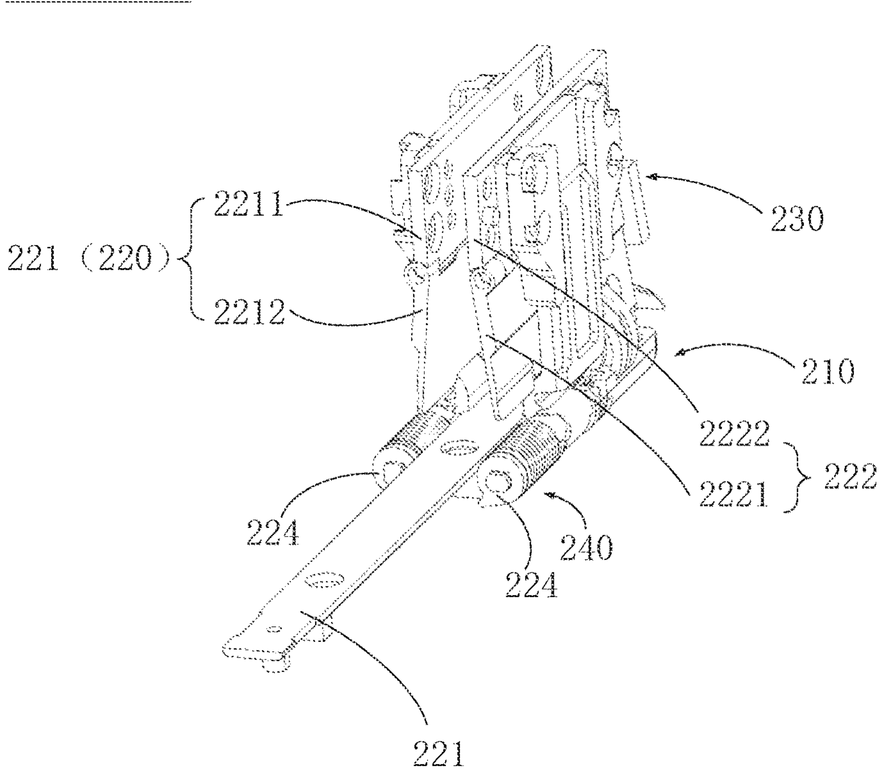
FIG. 5 is a schematic diagram of the hinge structure of the foldable display device in the folded state provided by an embodiment of the present application.

Further, referring to FIGS. 3 to 5, FIG. 3 is an exploded schematic diagram of a hinge structure of the foldable display device provided by an embodiment of the present application, FIG. 4 is a schematic diagram of the hinge structure of the foldable display device in the unfolded state provided by an embodiment of the present application, and FIG. 5 is a schematic diagram of the hinge structure of the foldable display device in the folded state provided by an embodiment of the present application.

In this embodiment, the first supporting plate 221 includes a first support 2211 and a second support 2212, and the second supporting plate 222 includes a third support 2221 and a fourth support 2222. The first support 2211 is connected to the first case 110; the second support 2212 is rotatably connected to one side of the fixing mechanism 210 and the first support 2211, respectively; the fourth support 2222 is connected to the second case 120; and the third support 2221 is rotatably connected to the other side of the fixing mechanism 210 and the fourth support 2222, respectively.

It should be noted that materials of the first support 2211, the second support 2212, the third support 2221, and the fourth support 2222 include, but are not limited to, steel.

In this embodiment, the first auxiliary supporting section 410 at least covers the connection position between the first support 2211 and the first case 110, the connection position between the first support 2211 and the second support 2212, the connection position between the second support 2212 and the fixing mechanism 210; and the second auxiliary supporting section 420 covers at least the connection position between the third support 2221 and the fixing mechanism 210, the connection position between the third support 2221 and the fourth support 2222, and the connection position between the fourth support 2222 and the second case 120.

Specifically, in this embodiment, a first gap 1 is defined at the connection position between the first support 2211 and the first case 110, a fifth gap 5 is defined at the connection position between the second support 2212 and the first support 2211, a second gap 2 is defined at the connection position between the second support 2212 and the fixing mechanism 210, a third gap 3 is defined at the connection position between the third support 2221 and the fixing mechanism 210, a sixth gap 6 is defined at the connection position between the third support 2221 and the fourth support 2222, and a fourth gap 4 is defined at the connection position between the fourth support 2222 and the second case 120.

In this embodiment, the first auxiliary supporting section 410 at least covers the connection position between the first support 2211 and the first case 110, the connection position between the first support 2211 and the second support 2212, the connection position between the second support 2212 and the fixing mechanism 210; and the second auxiliary supporting section 420 covers at least the connection position between the third support 2221 and the fixing mechanism 210, the connection position between the third support 2221 and the fourth support 2222, and the connection position between the fourth support 2222 and the second case 120. That is, the first auxiliary supporting section 410 covers the first gap 1, the fifth gap 5, and the second gap 2, and the second auxiliary supporting section 420 covers the third gap 3, the sixth gap 6, and the fourth gap 4, so as to cover step differences at connection positions of the first case 110, the first support 2211, the fixing mechanism 210, the second support 2212, the fixing mechanism 210, the third support 2221, the fourth support 2222, and the second case 120, thereby enhancing the user experience.

Further, the second support 2212 includes a plurality of second sub-supports (not shown), adjacent ones of the second sub-supports are rotatably connected to each other, and the first auxiliary supporting section 410 covers each connection position between adjacent ones of the second sub-supports. The third support 2221 includes a plurality of third sub-supports (not shown), adjacent ones of the third sub-supports are rotatably connected to each other, and the second auxiliary supporting section 420 covers each connection position between adjacent ones of third sub-supports. It is appreciated that, in this embodiment, the second support 2212 may be composed of a plurality of second sub-supports, or may be integrally formed as a single piece, the third support 2221 may be composed of a plurality of third sub-supports, and numbers of the second sub-supports and the third sub-supports both are not specifically limited in this embodiment.

Referring to FIGS. 1 to 5 in conjunction, in this embodiment, the first support 2211 is rotatably connected to the fixing mechanism 210, and the fourth support 2222 is rotatably connected to the fixing mechanism 210.

In this embodiment, the first support 2211 and the second support 2212 are both sleeved on a first rotating shaft (not shown), and the third support 2221 and the fourth support 2222 are all sleeved on the second rotating shaft (not shown), wherein the first support 2211 and the second support 2212 are movably connected by the first rotating shaft, and the third support 2221 and the fourth support 2222 are movably connected by the second rotating shaft, wherein each of the first rotating shaft and the second rotating shaft includes, but is not limited to, a pin shaft.

It is appreciated that the case that the first support 2211 and the second support 2212 are movably connected through the first rotating shaft, and the third support 2221 and the fourth support 2222 are movably connected through the second rotating shaft is only exemplary, and this embodiment is not specifically limited thereto.

In this embodiment, the first support 2211 and the second support 2212 are provided on one side of the fixing mechanism 210, and the third support 2221 and the fourth support 2222 are provided on the other side of the fixing mechanism 210, wherein the second support 2212 is rotatably connected to one side of the fixing mechanism 210, the third support 2221 is rotatably connected to the other side of the first support 2211, and the first support 2211 and the second support 2212 are movably connected through the first rotating shaft, and the third support 2221 and the fourth support 2222 are movably connected through the second rotating shaft, so that a degree of freedom of rotating in the hinge structure is increased, which allows the supporting mechanism 220 to be fully closed when the foldable display device 10 is in the folded state, so that the flexible display panel main body 300 in the foldable display device 10 can be fully closed and fully unfolded when the flexible display panel main body 300 is folded.

In this embodiment, the first auxiliary supporting section 410 includes a first auxiliary supporting part 411 and a second auxiliary supporting part 412 that are connected to each other, and the second auxiliary supporting section 420 includes a third auxiliary supporting part 421 and a fourth auxiliary supporting part 422 that are connected to each other.

When the foldable display device 10 is in a folded state, the first support 2211 and the fourth support 2222 are arranged opposite to each other, the second support 2212 and the third support 2221 are arranged opposite to each other, a first included angle θ1 is defined between the first support 2211 and the fourth support 2222, a second included angle θ2 is defined between the second support 2212 and the third support 2221, and the first included angle θ1 and the first-second included angle θ2 are different from each other. The first auxiliary supporting part 411 and the third auxiliary supporting part 421 are arranged opposite to each other, the second auxiliary supporting part 412 and the fourth auxiliary supporting part 422 are arranged opposite to each other. A third included angle θ3 is defined between the first auxiliary supporting part 411 and the third auxiliary supporting part 421, a fourth included angle θ4 is defined between the second auxiliary supporting part 412 and the fourth auxiliary supporting part 422, and the third included angle θ3 and the fourth included angle θ4 are different from each other.

Preferably, the third included angle is the same as the first included angle, and the fourth included angle is the same as the second included angle.

In this embodiment, when the foldable display device 10 is in the folded state, along a direction from the flexible display panel main body 300 to the fixing mechanism 210, a distance between the second support 2212 and the third support 2221 gradually increases, the first included angle is smaller than the second included angle, a distance between the second auxiliary supporting part 412 and the third auxiliary supporting part 421 gradually increases, and the third included angle is smaller than the fourth included angle.

Preferably, the first included angle and the third included angle are acute angles, and the second included angle and the fourth included angle are acute angles or angles of 0°.

In this embodiment, when the foldable display device 10 is switched from the state shown in FIG. 1 to the state shown in FIG. 2, that is, when the foldable display device 10 is in the folded state, the first support 2211, the second support 2212, the third support 2221, and the fourth support 2222 are inclined to form a wedge shape. Meanwhile, when driven by the first support 2211, the second support 2212, the third support, and the fourth support 2222, the first auxiliary supporting part 411, the second auxiliary supporting part 412, the third auxiliary supporting part 421, and the fourth auxiliary supporting part 422 are inclined to form a wedge shape. That is, the first auxiliary supporting section 410 and the second auxiliary supporting section 420 are located on opposite sides of the flexible display panel main body 300, thereby increasing a space for accommodating the flexible display panel main body 300, so that when the flexible display panel main body 300 is in the folded state, the flexible display panel main body 300 can be bent with a larger arc (such as a drop shape), which improves a folding situation of the flexible display panel main body 300 and prevents the risk of damage to the flexible display panel main body 300 due to excessively small folding arcs.

Figure 6:
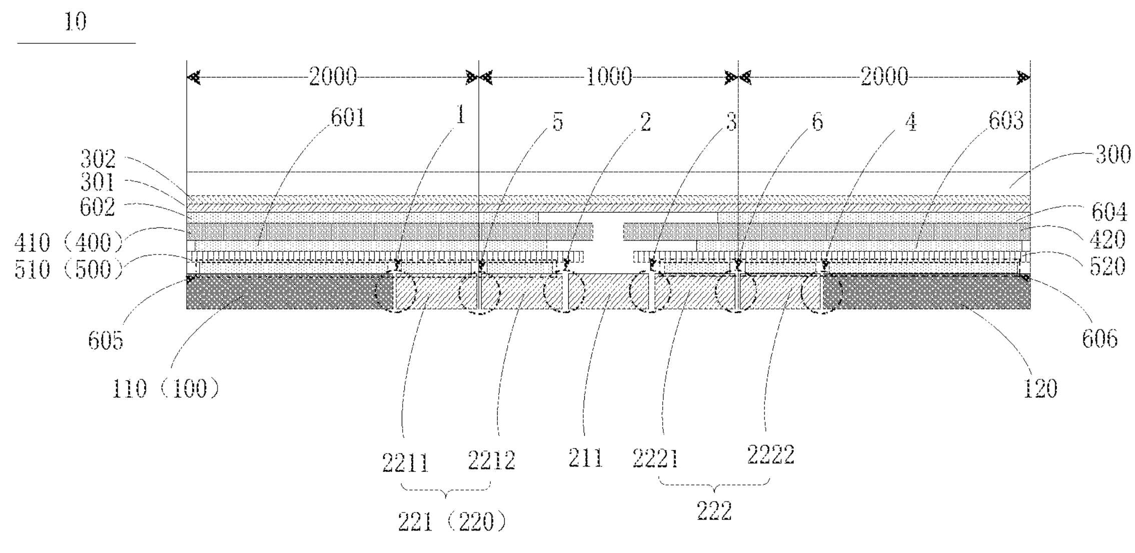
FIG. 6 is a schematic structural diagram of the foldable display device provided by an embodiment of the present application.

FIG. 6 is a schematic structural diagram of a foldable display device provided by an embodiment of the present application.

In this embodiment, the foldable display device 10 further includes a heat dissipation layer 500 located between the auxiliary supporting layer 400 and the hinge structure 200. Specifically, the heat dissipation layer 500 includes, but is not limited to, a metallic copper layer, a pressure-sensitive adhesive layer, a white latex layer, a foam rubber layer, and a heat dissipation film that are sequentially away from the auxiliary supporting layer 400.

In this embodiment, the heat dissipation layer 500 is disposed between the auxiliary supporting layer 400 and the hinge structure 200, so as to improve the heat dissipation performance of the auxiliary supporting layer 400, thereby preventing the flexible display panel main body 300 from being damaged by heat.

A thickness of the metallic copper layer is 80 microns, a thickness of the pressure-sensitive adhesive layer is 10 microns, a thickness of the white latex layer is microns, a thickness of the foam rubber layer is 70 microns, and a thickness of the heat dissipation film is 15 microns.

In this embodiment, the heat dissipation layer 500 includes a first heat dissipation layer 510 and a second heat dissipation layer 520 arranged at intervals; a first adhesive layer 601 is provided between the first heat dissipation layer 510 and the first auxiliary supporting section 410, a second adhesive layer 602 is provided between the first auxiliary supporting section 410 and the flexible display panel main body 300, a third adhesive layer 603 is provided between the second heat dissipation layer 520 and the second auxiliary supporting section 420, and a fourth adhesive layer 604 is provided between the second auxiliary supporting section 420 and the flexible display panel main body 300, wherein the first adhesive layer 601 and the second adhesive layer 602 are arranged at intervals, and the third adhesive layer 603 and the fourth adhesive layer 604 are arranged at intervals.

It is appreciated that the first adhesive layer 601 is configured to adhere the first auxiliary supporting section 410 and the first heat dissipation layer 510; the second adhesive layer 602 is configured to adhere the first auxiliary supporting section 410 and the flexible display panel main body 300; the third adhesive layer 603 is configured to adhere the second auxiliary supporting section 420 and the second heat dissipation layer 520; and the fourth adhesive layer 604 is configured to adhere the second auxiliary supporting section 420 and the flexible display panel main body 300. Each of the first adhesive layer 601, the second adhesive layer 602, the third adhesive layer 603, and the fourth adhesive layer 604 includes, but is not limited to, a pressure sensitive adhesive.

Specifically, when the foldable display device 10 is in a flattened state, the second adhesive layer 602 covers the connection position between the first support 2211 and the first case 110 and the connection position between the first support 2211 and the second support 2212, the fourth adhesive layer 604 covers the connection position between the third support 2221 and the fourth support 2222 and the connection position between the fourth support 2222 and the second case 120.

Further, in this embodiment, a second gap (not shown) is defined between the first adhesive layer 601 and the third adhesive layer 603, the second gap is larger than the first gap, and the second gap is defined corresponding to the bending area 1000.

Specifically, when the foldable display device 10 is in a flattened state, an orthographic projection of the first gap on the flexible display panel main body 300 is located within a boundary of an orthographic projection of an inner wall of the second gap on the flexible display panel main body 300.

In this embodiment, the foldable display device 10 further includes a fifth adhesive layer 605 located between the first heat dissipation layer 510 and the first supporting plate 221, and a sixth adhesive layer 606 located between the second heat dissipation layer 520 and the second supporting plate 222.

Specifically, the fifth adhesive layer 605 is configured to adhere the first heat dissipation layer 510 and the first case 110, and adhere the first heat dissipation layer 510 and the first supporting plate 221. The sixth adhesive layer 606 is configured to adhere the second heat dissipation layer 520 and the second case 120, and adhere the second heat dissipation layer 520 and the second supporting plate 222.

In this embodiment, an orthographic projection of the fifth adhesive layer 605 on the first case 110 and the first supporting plate 221 does not overlap the first gap 1, the fifth gap 5, and the second gap 2, and an orthographic projection of the sixth adhesive layer 606 on the second case 120 and the second supporting plate 222 does not overlap the third gap 3, the sixth gap 6, and the second gaps 2, so as to prevent the fifth adhesive layer 605 and the sixth adhesive layer 606 from affecting the bending of the first supporting plate 221 and the second supporting plate 222.

It should be noted that a support film 301 and a heat dissipation film 302 (which can be adhered by an adhesive layer) are further provided under the flexible display panel main body 300, wherein a material of the support film 301 includes but is not limited to stainless steel (SUS), and a material of the heat dissipation film 302 includes but is not limited to foam rubber. In this embodiment, each of the support film 301 and the heat dissipation film 302 is an integral structure.

It is appreciated that, in this embodiment, there is a difference between the support film 301 and the auxiliary supporting layer 400, and there is a difference between the heat dissipation film 302 and the heat dissipation layer 500. The support film 301 supports an entire surface of the flexible display panel main body 300, the heat dissipation film 302 dissipates heat of an entire surface of the flexible display panel main body 300, and the auxiliary supporting layer 400 and the heat dissipation layer 500 are disposed between the flexible display panel main body 300 and the hinge structure 200. The auxiliary supporting layer 400 is also configured to eliminate the sense of the step difference at the connection position of the supporting plate in the hinge structure 200, and the heat dissipation layer 500 is configured to dissipate heat in a local area. Therefore, the support film 301 and the auxiliary supporting layer 400 are different, and the heat dissipation film 302 and the heat dissipation layer 500 are also different.

Figure 7:
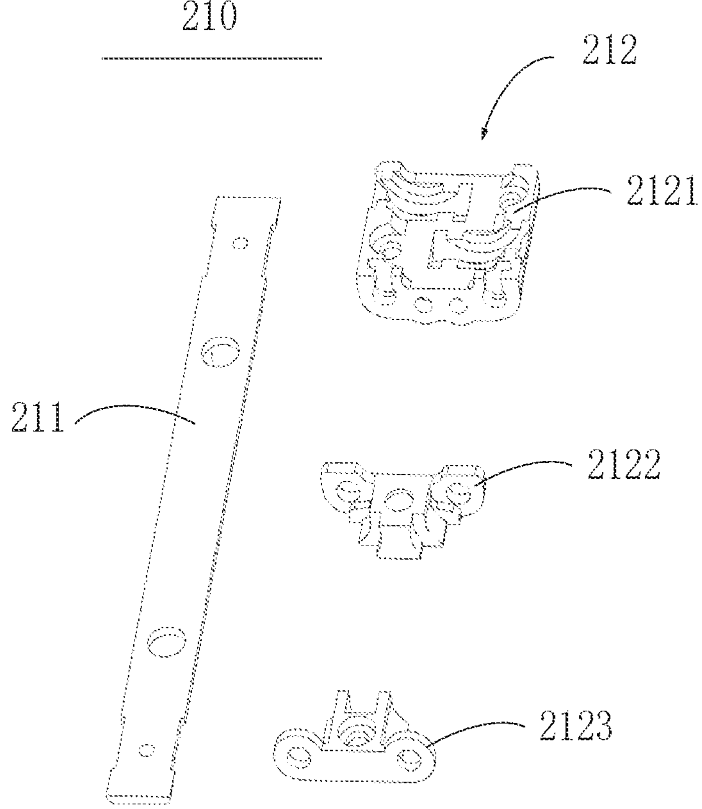
FIG. 7 is a schematic diagram of a fixing mechanism of the hinge structure of the foldable display device according to an embodiment of the present application.

Referring to FIG. 1 to FIG. 7 in conjunction, FIG. 7 is a schematic diagram of a fixing mechanism of a hinge structure of a foldable display device provided by an embodiment of the present application.

In this embodiment, the fixing mechanism 210 includes an intermediate supporting plate 211 and a fixing bracket 212. The intermediate supporting plate 211 is movably connected to the fixing bracket 212, the first supporting plate 221 is located on one side of the intermediate supporting plate 211, and the second supporting plate 222 is located on the other side of the intermediate supporting plate 211.

When the foldable display device 10 is in the flattened state, the first supporting plate 221, the intermediate supporting plate 211, the second supporting plate 222, and the intermediate supporting plate 211 together form a flat surface, wherein the auxiliary supporting layer 400 covers at least the connection position between the first supporting plate 221 and the first case 110, a gap between the first supporting plate 221 and the intermediate supporting plate 211, and a gap between the intermediate supporting plate 211 and the second supporting plate 222, and the connection position between the second supporting plate 222 and the second case 120.

Specifically, in this embodiment, the first support 2211 and the second support 2212 are located on one side of the intermediate supporting plate 211, and the third support 2221 and the fourth support 2222 are located on the other side of the intermediate supporting plate 211.

When the foldable display device 10 is in the flattened state, the first support 2211, the second support 2212, the intermediate supporting plate 211, the third support 2221, and the fourth support 2222 together form the flat surface, wherein the first auxiliary supporting section 410 at least covers the connection position between the first support 2211 and the first case 110, the connection position between the first support 2211 and the second support 2212, and the gap between the second support 2212 and the intermediate supporting plate 211. The second auxiliary supporting section 420 covers at least the gap between the intermediate supporting plate 211 and the third support 2221, the connection position between the third support 2221 and the fourth support 2222, and the connection position between the fourth support 2222 and the second case 120. As such, when the flexible display panel main body 300 is in the flattened state, step differences at each connection position of the first support 2211, the second support 2212, the intermediate supporting plate 211, the third support 2221, and the fourth support 2222 are covered, thereby enhancing the user experience.

Figure 8:
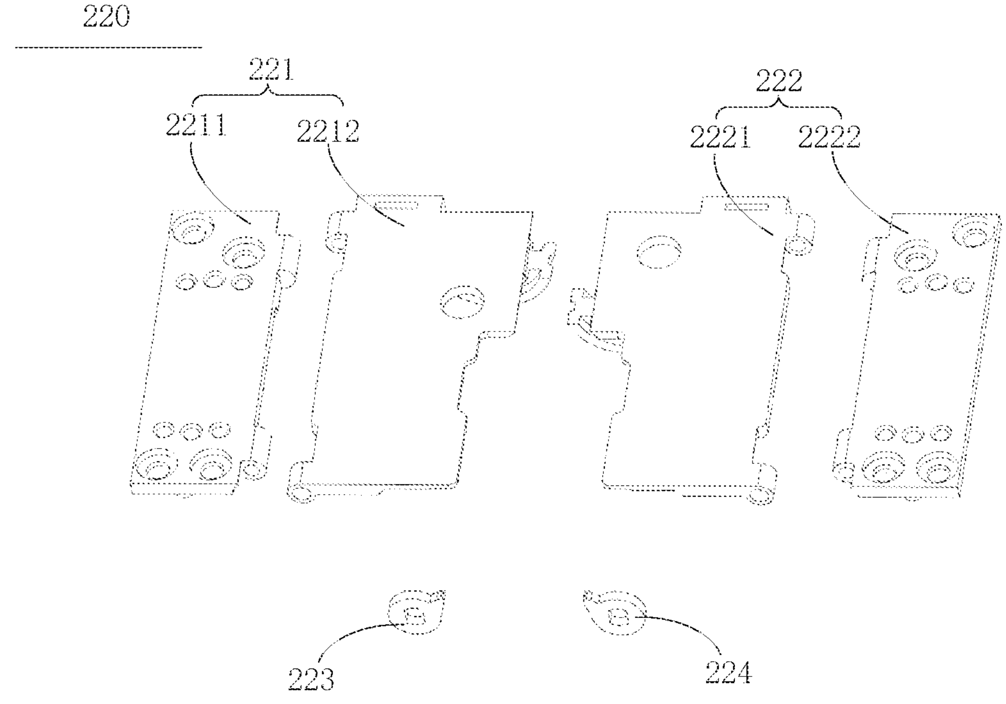
FIG. 8 is a schematic diagram of a supporting mechanism of the hinge structure of the foldable display device provided by an embodiment of the present application.

Further, referring to FIG. 8, FIG. 8 is a schematic diagram of a supporting mechanism of a hinge structure of a foldable display device provided by an embodiment of the present application.

In this embodiment, the supporting mechanism 220 further includes a fifth support 223 and a sixth support 224. Both the fifth support 223 and the sixth support 224 can be movably connected to the fixing bracket 212, and the auxiliary supporting layer 400 covers the fifth support 223 and the sixth support 224 in an orthographic projection direction of the supporting mechanism 220.

When the foldable display device 10 is in the flattened state, the fifth support 223 and the sixth support 224 support the intermediate supporting plate 211, and the intermediate supporting plate 211 is away from the fixing bracket 212. It should be noted that materials of the intermediate supporting plate 211, the fifth support 223, and the sixth support 224 include but are not limited to steel.

Further, the fifth support 223 includes protrusions (not shown), and the sixth support 224 includes protrusions (not shown). When the foldable display device 10 is in the flattened state, the protrusion supports the intermediate supporting plate 211, and when the foldable display device 10 is in the folded state, there is a gap between the protrusions and the intermediate supporting plate 211. It is appreciated that this embodiment does not further limit a shape of the protrusions.

Figure 9:
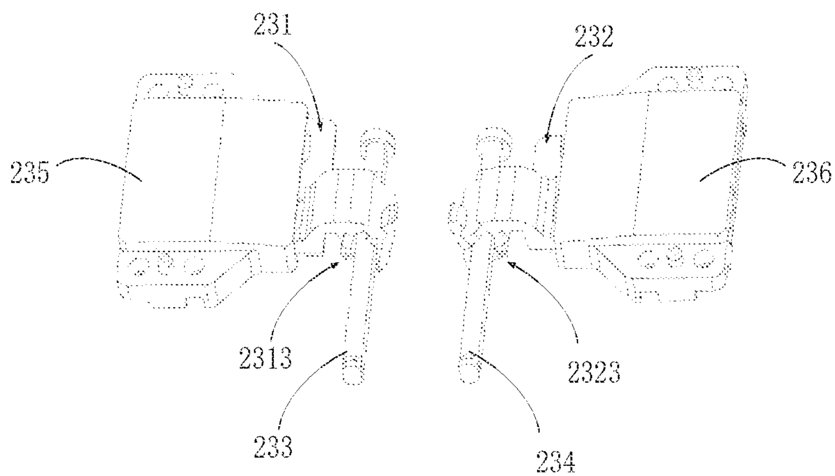
FIG. 9 is a schematic diagram of a rotating mechanism of the hinge structure of the foldable display device provided by an embodiment of the present application.
Figure 10:
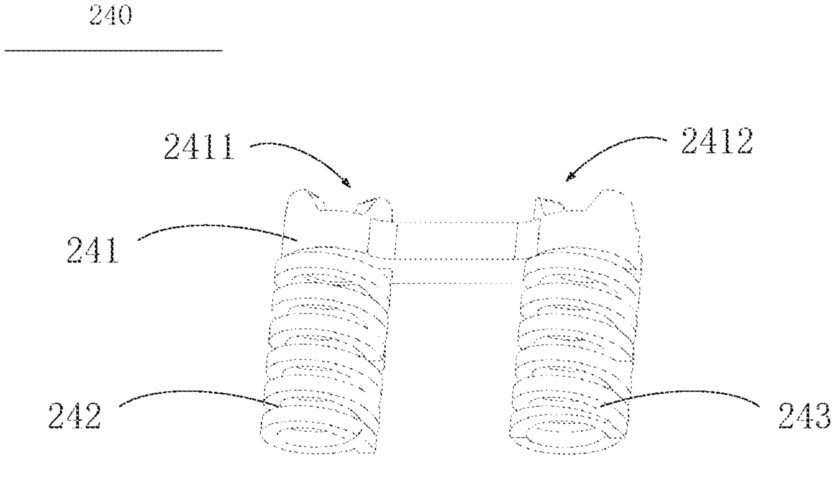
FIG. 10 is a schematic diagram of a positioning mechanism of the hinge structure of the foldable display device provided by an embodiment of the present application.

Referring to FIGS. 1-9 in conjunction, FIG. 9 is a schematic diagram of a rotating mechanism of a hinge structure of a foldable display device provided by an embodiment of the present application.

In this embodiment, the first support 2211 is slidably connected to the fixing bracket 212, and the fourth support 2222 is slidably connected to the fixing bracket 212.

Specifically, the hinge structure 200 further includes a rotating mechanism 230, and the rotating mechanism 230 includes a first connecting member 231, a second connecting member 232, a first rotating member 233, a second rotating member 234, a first mounting member 235, and a second mounting member 236.

One end of the first connecting member 231 is rotatably connected to the fixing bracket 212, the other end of the first connecting member 231 is slidably connected to the first support 2211, one end of the connecting member 232 is rotatably connected to the fixing bracket 212, and the other end of the second connecting member 232 is slidably connected to the fourth support 2222.

The first rotating member 233 is rotatably connected to the fixing bracket 212, the first mounting member 235 is fixedly connected to the first support 2211, and one end of the first connecting member 231 is fixedly connected to the first rotating member 233, and the other end of the first connecting member 231 is slidably connected to the first mounting member 235. The second rotating member 234 is rotatably connected to the fixing bracket 212, the second mounting member 236 is fixedly connected to the fourth support 2222, one end of the second connecting member 232 is fixedly connected to the second rotating member 234, and the other end of the second connecting member 232 is slidably connected to the second mounting member 236.

It should be noted that materials of the first connecting member 231 and the second connecting member 232 include but are not limited to steel.

It is appreciated that, in this embodiment, methods of fixedly connecting the first mounting member 235 to the second support 2212 and methods of fixedly connecting the second mounting member 236 to the fourth support 2222 are not specifically limited.

In this embodiment, the first rotating member 233 and the second rotating member 234 include but are not limited to gear shafts, and materials of the first mounting member 235 and the second mounting member 236 include but are not limited to steel. None of the above is specifically limited in this embodiment.

In this embodiment, the first connecting member 231 includes a first main body portion 2311 and a first extension portion 2312 extending from one end of the first main body portion 2311, and the second connecting member 232 includes a second main body portion 2321 and a second extension portion 2322 extending from one end of the second main body portion 2321; wherein the first main body portion 2311 is slidably connected to the first mounting member 235, and the first extension portion 2312 is provided with a first hole (not shown) for the first rotating member 233 to pass through, the second main body portion 2321 is slidably installed on the second mounting member 236, and the second extension portion 2322 is provided with a second hole (not shown) for the first rotating member 233 to pass through.

Further, in this embodiment, the first mounting member 235 is provided with a first sliding groove 2351, the second mounting member 236 is provided with a second sliding groove 2361, the first main body portion 2311 is slidably installed in the first sliding groove 2351, and the second main body portion 2321 is slidably installed in the second sliding groove 2361.

Further, in this embodiment, the fifth support 223 is fixedly connected to the first rotating member 233, and the sixth support 224 is fixedly connected to the second rotating member 234.

In this embodiment, the fixing bracket 212 includes a main bracket 2121, a first bracket 2122, and a second bracket 2123.

The first rotating member 233 and the second rotating member 234 are rotatably connected to the main bracket 2121, and the first bracket 2122 is sleeved on the first rotating member 233 and the second rotating member. 234. The first bracket 2122 is provided with a first recess (not shown) and a second recess (not shown), the first extension portion 2312 is rotatably accommodated in the first recess, and the second extension portion 2322 is rotatably accommodated in the second recess.

In this embodiment, the main bracket 2121 includes an arc-shaped sliding groove (not shown), the second support 2212 includes a first sliding block (not shown), and the third support 2221 includes a second sliding block (not shown), wherein the first sliding block and the second sliding block rotate in the arc-shaped sliding groove.

In this embodiment, the second bracket 2123 is sleeved on the first rotating member 233 and the second rotating member 234, and the fifth support 223 and the sixth support 224 are located at a side of the first bracket 2122 away from the main bracket 2121, the second bracket 2123 is located between the fifth support 223 and the first bracket 2122 and between the sixth support 224 and the first bracket 2122, and the fifth support 223 and the sixth support 224 abut against the second bracket 2123.

It should be noted that materials of the main bracket 2121, the first bracket 2122, and the second bracket 2123 include but are not limited to steel.

In this embodiment, the fifth support 223 and the sixth support 224 support the intermediate supporting plate 211, while the fifth support 223 and the sixth support 224 abut the second bracket 2123, thereby preventing the second bracket 2123 from being separated from the first rotating member 233 and the second rotating member 234, and maintaining the stability of the hinge structure.

Further, in this embodiment, the intermediate supporting plate 211 is slidably connected to the first bracket 2122 and the second bracket 2123, so that the intermediate supporting plate 211 can only slide linearly in a direction perpendicular to the fixing bracket 212 to prevent the intermediate supporting plate 211 from moving in other directions. The intermediate supporting plate 211 is connected to the first bracket 2122 through a first elastic member (not shown), and when the foldable display device 10 is in the folded state or the flattened state, the first elastic member is in an elastic deformation state, that is, the first elastic member generates a pulling force that moves the intermediate supporting plate 211 toward the first bracket 2122.

It should be noted that, in this embodiment, the first elastic member includes but is not limited to a spring.

Referring to FIGS. 1-10, FIG. 10 is a schematic diagram of a positioning mechanism of the hinge structure of the foldable display device provided by an embodiment of the present application.

In this embodiment, the hinge structure 200 further includes a positioning mechanism 240, and the positioning mechanism 240 includes a positioning member 241, wherein the positioning member 241 is sleeved on the first rotating member 233 and the second rotating member 234. The positioning member 241 includes a first protrusion 2411 facing toward the first extension portion 2312 of the first connecting member 231 and a second protrusion 2412 facing toward facing the second extension portion 2322 of the second connecting member 232, the first extension portion 2312 of the first connecting member 231 is provided with a first groove 2313, and the second extension portion 2322 of the second connecting member 232 is provided with a second groove 2323. When the supporting mechanism 220 is in the flattened state or in the folded state, the first protrusion 2411 is accommodated in the first groove 2313, and the second protrusion 2412 is accommodated in the second groove 2323.

The positioning mechanism 240 further includes a second elastic member 242 and a third elastic member 243, wherein the second elastic member 242 is sleeved on the first rotating member 233, one end of the second elastic member 242 is connected to the positioning member 241, another end of the second elastic member 242 is connected to the second bracket 2123, the third elastic member 243 is sleeved on the second rotating member 234, one end of the third elastic member 243 is connected to the positioning member 241, and another end of the third elastic member 243 is connected to the second bracket 2123. When the foldable display device 10 is in the folded state or in the flattened state, each of the second elastic member 242 and the third elastic member 243 is in an elastic deformation state.

In this embodiment, when the first rotating member 233 rotates, the first groove 2313 rotates accordingly, and the first protrusion 2411 is accommodated in the first groove 2313. When the second rotating member 234 rotates, the second groove 2323 rotates accordingly, and the second protrusion 2412 is accommodated in the second groove 2323. Through the cooperation of the rotating mechanism 230 and the positioning mechanism 240, when the first rotating member 233 and the second rotating member 234 rotate from a unfolded state to 0-10 degrees, the hinge structure will automatically return to the unfolded position from a folded state; and when the first rotating member 233 and the second rotating member 234 rotate from the unfolded state to 80 degrees to 90 degrees, the hinge structure will automatically rotate to the folded state, that is, a position of 90 degrees, thereby enhancing the user experience.

It should be noted that a material of the positioning member 241 includes but is not limited to steel, and the second elastic member 242 and the third elastic member 243 include but are not limited to springs. None of the above is specifically limited in this embodiment.

Figure 11:
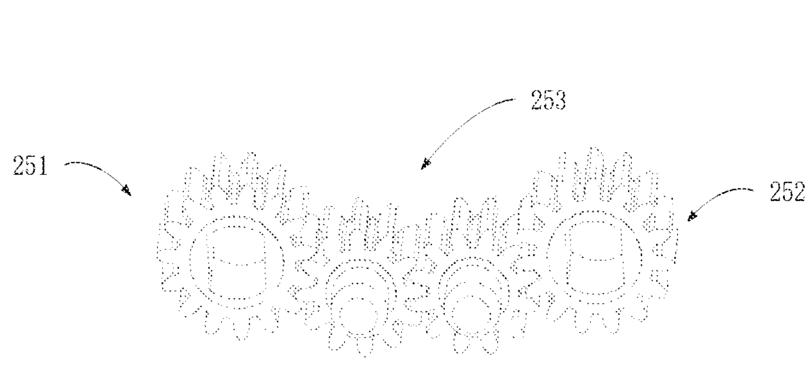
FIG. 11 is a schematic diagram of a synchronization mechanism of the hinge structure of the foldable display device provided by an embodiment of the present application.

Referring to FIGS. 1 to 11 in conjunction, FIG. 11 is a schematic diagram of a synchronization mechanism of the hinge structure of the foldable display device provided by an embodiment of the present application.

In this embodiment, the hinge structure 200 further includes a synchronization mechanism 250. The synchronization mechanism 250 includes a first synchronization element 251, a second synchronization element 252, and a third synchronization element 253. The first synchronization element 251 is connected to the first rotating member 233, the second synchronization element 252 is connected to the second rotating member 234, and the first synchronization element 251 is synchronously connected to the second synchronization element 252 through the third synchronization element 253, so that the first rotating member 233 and the second rotating member 234 rotate synchronously.

In this embodiment, the synchronization mechanism 250, the rotating mechanism 230, and the positioning mechanism 240 cooperate. The synchronization mechanism 250 and the rotating mechanism 230 can drive the first support 2211, the second support 2212, the third support 2221, and the fourth support 2222 to respectively rotate synchronously along the fixing bracket 212, which improves consistency and stability of movement of the first support 2211 and the second support 2212 with the third support 2221 and the fourth support 2222, thereby improving the stability of the hinge structure 200.

Specifically, the first synchronization element 251 includes a first gear, the second synchronization element 252 includes a second gear, and the third synchronization element 253 includes two third gears that engage with each other. The two third gears are rotatably connected to the main bracket 2121 and the first bracket 2122, the first gear is sleeved on the first rotating member 233, the second gear is sleeved on the second rotating member 234, the first gear engages with one of the two third gears, and the second gear engages with the other one of the two third gears.

It should be noted that the case that the first synchronization element 251 includes a first gear, the second synchronization element 252 includes a second gear, and the third synchronization element 253 includes two third gears that engage with each other is only exemplary, and this embodiment does not specifically limit types of the synchronization mechanism 250.

Referring to FIGS. 1 and 3 in conjunction, in this embodiment, the foldable display device 10 further includes a dust-proof structure 260, and the dust-proof structure 260 is disposed at a connection position of the fixing mechanism 210 and the supporting mechanism 220, Further, the dust-proof structure 260 is located on a side of the first support 2211, the second support 2212, the third support 2221, and the fourth support 2222 away from the intermediate supporting plate 211, and covers at least a part of the flexible display panel main body 300, thereby preventing foreign matter from entering the sides of the flexible display panel main body 300 and causing damage to the flexible display panel main body 300.

In the above embodiments, the descriptions of each embodiment have their own emphasis. The parts that are not described in detail in an embodiment can be referred to the detailed descriptions in other embodiments above, which will not be repeated herein for brevity.

It is appreciated that for those of ordinary skill in the art, equivalent substitutions or changes can be made according to the technical solutions and inventive concepts of the present application, and all these changes or substitutions shall fall within the protection scope of the appended claims of the present application.

What is claimed is:

1. A foldable display device, comprising:

a case comprising a first case and a second case;

a hinge structure accommodated in the case and connected to the first case and the second case, wherein the hinge structure comprises a fixing mechanism and a supporting mechanism, and the supporting mechanism comprises a first supporting plate located on one side of the fixing mechanism and corresponding to the first case and a second supporting plate located on another side of the fixing mechanism and corresponding to the second case, wherein the first supporting plate is rotatably connected to the one side of the fixing mechanism, and the second supporting plate is rotatably connected to the another side of the fixing mechanism, a first gap is defined at a connection position between the first supporting plate and the first case, and a fourth gap is defined at a connection position between the second supporting plate and the second case;

the fixing mechanism comprises an intermediate supporting plate and a fixing bracket, the first supporting plate is located on one side of the intermediate supporting plate, and a second gap is defined at a connection position between the first supporting plate and the intermediate supporting plate; the second supporting plate is located on another side of the intermediate supporting plate, and a third gap is defined at a connection position between the second supporting plate and the intermediate supporting plate, the intermediate supporting plate is slidably connected to the fixing bracket so that the intermediate supporting plate only slides linearly in a direction perpendicular to the fixing bracket, a flexible display panel main body arranged in the case and located on one side of the first case, the second case, and the hinge structure;

an auxiliary supporting layer arranged between the flexible display panel main body and the hinge structure, wherein the auxiliary supporting layer covers at least the first gap, the second gap, the third gap, and the fourth gap.

2. The foldable display device according to claim 1, wherein the flexible display panel main body comprises: a bending area corresponding to the hinge structure and non-bending areas located on opposite sides of the bending area; and wherein the auxiliary supporting layer comprises a first auxiliary supporting section and a second auxiliary supporting section that are arranged at intervals, a first opening is defined between the first auxiliary supporting section and the second auxiliary supporting section, and the first opening is defined corresponding to the bending area.

3. The foldable display device according to claim 2, wherein the first opening is less than or equal to 14 mm.

4. The foldable display device according to claim 2, wherein the first supporting plate comprises a first support and a second support, the second supporting plate comprises a third support and a fourth support, the first support is connected to the first case, the second support is rotatably connected to the one side of the fixing mechanism and the first support respectively, the fourth support is connected to the second case, and the third support is rotatably connected to the another side of the fixing mechanism and the fourth support respectively; and wherein the first auxiliary supporting section covers at least a connection position between the first support and the first case, a connection position between the first support and the second support, and a connection position between the second support and the fixing mechanism; and the second auxiliary supporting section covers at least a connection position between the third support and the fixing mechanism, a connection position between the third support and the fourth support, and a connection position between the fourth support and the second case.

5. The foldable display device according to claim 4, wherein the first auxiliary supporting section comprises a first auxiliary supporting part and a second auxiliary supporting part connected to each other, and the second auxiliary supporting section comprises a third auxiliary supporting part and a fourth auxiliary supporting part which are connected to each other;

wherein when the foldable display device is in a folded state, the first support and the fourth support are arranged opposite to each other, the second support and the third support are arranged opposite to each other, the first support and the fourth support have a first included angle θ1, the second support and the third support have a second included angle θ2, and the first included angle θ1 is different from the second included angle θ2; and wherein when the foldable display device is in a folded state, the first auxiliary supporting part and the third auxiliary supporting part are arranged opposite to each other, the second auxiliary supporting part and the fourth auxiliary supporting part are arranged opposite to each other, the first auxiliary supporting part and the third auxiliary supporting part have a third included angle θ3, the second auxiliary supporting part and the fourth auxiliary supporting part have a fourth included angle θ4, and the third included angle θ3 is different from the fourth included angle θ4.

6. The foldable display device according to claim 5, wherein the third included angle is same as the first included angle, and the fourth included angle is same as the second included angle.

7. The foldable display device according to claim 5, wherein when the foldable display device is in the folded state, along a direction from the flexible display panel main body to the fixing mechanism, a distance between the second support and the third support gradually increases, the first included angle is smaller than the second included angle, and a distance between the second auxiliary supporting part and the third auxiliary supporting part gradually increases, and the third included angle is smaller than the fourth included angle.

8. The foldable display device according to claim 2, wherein the foldable display device further comprises a heat dissipation layer located between the auxiliary supporting layer and the hinge structure, and the heat dissipation layer comprises a first heat dissipation layer and a second heat dissipation layer arranged at intervals;

wherein a first adhesive layer is provided between the first heat dissipation layer and the first auxiliary supporting section, a second adhesive layer is provided between the first auxiliary supporting section and the flexible display panel main body, a third adhesive layer is provided between the second heat dissipation layer and the second auxiliary supporting section, and a fourth adhesive layer is provided between the second auxiliary supporting section and the flexible display panel main body, wherein the first adhesive layer and the second adhesive layer are arranged at intervals, and the third adhesive layer and the fourth adhesive layer are arranged at intervals; and wherein the second adhesive layer covers a connection position between a first support and the first case and a connection position between the first support and a second support, and the fourth adhesive layer covers a connection position between a third support and a fourth support and a connection position between the fourth support and the second case.

9. The foldable display device according to claim 8, wherein a second opening is defined between the first adhesive layer and the third adhesive layer, the second opening is larger than the first opening, and the second opening is defined corresponding to the bending area.

10. The foldable display device according to claim 1, wherein a modulus of the auxiliary supporting layer is 10 to 250 GPa, and a thickness of the auxiliary supporting layer is 0.01 to 0.2 mm.

11. The foldable display device according to claim 1, wherein when the foldable display device is in a flattened state, the first supporting plate, the intermediate supporting plate, the second supporting plate, and the intermediate supporting plate together form a flat surface.

12. The foldable display device according to claim 11, wherein the supporting mechanism further comprises a fifth support and a sixth support, both the fifth support and the sixth support are movably connected to the fixing bracket, and the auxiliary supporting layer covers the fifth support and the sixth support in an orthographic projection direction of the supporting mechanism; and wherein when the foldable display device is in the flattened state, the fifth support and the sixth support are configured to support the intermediate supporting plate, and the intermediate supporting plate is located away from the fixing bracket.

13. The foldable display device according to claim 12, wherein the fifth support comprises a protrusion, and the sixth support comprises a protrusion, and when the foldable display device is in the flattened state, the protrusions are configured to support the intermediate supporting plate, and when the foldable display device is in a folded state, there is a gap between each of the protrusions and the intermediate supporting plate.

14. The foldable display device according to claim 4, wherein the hinge structure further comprises a rotating mechanism, and the rotating mechanism comprises a first connecting member and a second connecting member; and wherein one end of the first connecting member is rotatably connected to the fixing bracket, another end of the first connecting member is slidably connected to the first support, one end of the second connecting member is rotatably connected to the fixing bracket, and another end of the second connecting member is slidably connected to the fourth support.

15. The foldable display device according to claim 14, wherein the rotating mechanism further comprises a first rotating member, a second rotating member, a first mounting member, and a second mounting member; and wherein the first rotating member is rotatably connected to the fixing bracket, the first mounting member is fixedly connected to the first support, the one end of the first connecting member is fixedly connected to the first rotating member, and the another end of the first connecting member is slidably connected to the first mounting member; wherein the second rotating member is rotatably connected to the fixing bracket, the second mounting member is fixedly connected to the fourth support, the one end of the second connecting member is fixedly connected to the second rotating member, and the another end of the second connecting member is slidably connected to the second mounting member.

16. The foldable display device according to claim 15, wherein the first connecting member comprises a first main body portion and a first extension portion extending from one end of the first main body portion, and the second connecting member comprises a second main body portion and a second extension portion extending from one end of the second main body portion; wherein the first main body portion is slidably connected to the first mounting member, the first extension portion is provided with a first hole for the first rotating member to pass through, the second main body portion is slidably installed on the second mounting member, and the second extension portion is provided with a second hole for the first rotating member to pass through.

17. The foldable display device according to claim 16, wherein the first mounting member is provided with a first sliding groove, the second mounting member is provided with a second sliding groove, the first main body portion is slidably installed in the first sliding groove, and the second main body portion is slidably installed in the second sliding groove.

18. The foldable display device according to claim 16, wherein the hinge structure further comprises a positioning mechanism, and the positioning mechanism comprises a positioning member; wherein the positioning member is sleeved on the first rotating member and the second rotating member, the positioning member comprises a first protrusion facing toward the first extension portion of the first connecting member and a second protrusion facing toward the second extension portion of the second connecting member, the first extension portion of the first connecting member is provided with a first groove, and the second extension portion of the second connecting member is provided with a second groove; and wherein when the supporting mechanism is in a flattened state or in a folded state, the first protrusion is accommodated in the first groove, and the second protrusion is accommodated in the second groove.

19. The foldable display device according to claim 15, wherein the hinge structure further comprises a synchronization mechanism, the synchronization mechanism comprises a first synchronization element, a second synchronization element, and a third synchronization element, the first synchronization element is connected to the first rotating member, the second synchronization element is connected to the second rotating member, and the first synchronization element is synchronously connected to the second synchronization element through the third synchronization element so that the first rotating member and the second rotating member rotate synchronously.

* * * * *